(12) United States Patent
Ui et al.

(10) Patent No.: US 8,821,744 B2
(45) Date of Patent: Sep. 2, 2014

(54) SUBSTRATE PROCESSING METHOD AND SUBSTRATE PROCESSING APPARATUS

(75) Inventors: Akio Ui, Tokyo (JP); Hisataka Hayashi, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 132 days.

(21) Appl. No.: 13/051,771

(22) Filed: Mar. 18, 2011

(65) Prior Publication Data

US 2012/0080408 A1 Apr. 5, 2012

(30) Foreign Application Priority Data

Sep. 30, 2010 (JP) ................................ P2010-223171

(51) Int. Cl.
*B44C 1/22* (2006.01)
(52) U.S. Cl.
USPC ................................ 216/71; 216/67; 438/710
(58) Field of Classification Search
None
See application file for complete search history.

(56) References Cited

U.S. PATENT DOCUMENTS

| 7,851,367 | B2 | 12/2010 | Ui |
| 2008/0237185 | A1 | 10/2008 | Ui et al. |
| 2009/0078678 | A1 | 3/2009 | Kojima et al. |
| 2009/0194508 | A1 | 8/2009 | Ui et al. |
| 2010/0072172 | A1 | 3/2010 | Ui et al. |
| 2010/0315064 | A1* | 12/2010 | Kuthi et al. .................. 324/111 |
| 2011/0139748 | A1* | 6/2011 | Donnelly et al. ............... 216/37 |

FOREIGN PATENT DOCUMENTS

| JP | 8-255782 | 10/1996 |
| JP | 08-264509 | 10/1996 |
| JP | 10-4085 | 1/1998 |
| JP | 2010-103465 | 5/2010 |

OTHER PUBLICATIONS

Hayashi et al; "Method for Manufacturing Semiconductor Device and Semiconductor Manufacturing Apparatus", U.S. Appl. No. 13/043,017, filed Mar. 8, 2011.
Notification of Reasons for Refusal issued by the Japanese Patent Office on Sep. 25, 2012, for Japanese Patent Application No. 2010-223171, and English-language translation thereof.
The Second Office Action issued by the State Intellectual Property Office of the People's Republic of China on May 5, 2014, for Chinese Patent Application No. 201110281390.0, and English-language translation thereof.

* cited by examiner

*Primary Examiner* — Lan Vinh
*Assistant Examiner* — Jiong-Ping Lu
(74) *Attorney, Agent, or Firm* — Finnegan, Henderson, Farabow, Garrett & Dunner, L.L.P.

(57) ABSTRACT

A substrate processing method using a substrate processing apparatus includes a first step and a second step. The first step is to apply a negative voltage pulse from a pulsed power supply to be included in the apparatus. The second step is to apply floating potential for an interval of time between the negative voltage pulse and a positive voltage pulse from the pulsed power supply subsequent to the negative voltage pulse. In addition, the apparatus includes a chamber, a first electrode, a second electrode, an RF power supply, and the pulsed power supply. The second electrode is provided so that the second electrode faces the first electrode to hold a substrate. The RF power supply applies an RF voltage having a frequency of 50 MHz or higher to the second electrode. The pulsed power supply repeatedly applies a voltage waveform with the RF voltage to the second electrode.

9 Claims, 14 Drawing Sheets

SUBSTRATE PROCESSING METHOD AND SUBSTRATE PROCESSING APPARATUS

CROSS REFERENCE TO RELATED APPLICATION

This application is based upon and claims the benefit of priority from the prior Japanese Patent Application No. 2010-223171, filed on Sep. 30, 2010, the entire contents of which are incorporated herein by reference.

FIELD

Embodiments relate basically to a substrate processing method using plasma and a substrate processing apparatus.

BACKGROUND

In general, a parallel-plate type substrate processing apparatus generates plasma by applying an RF (radio-frequency) voltage to one of a pair of electrodes to process a substrate (i.e., wafer) placed on the electrode to which the RF voltage is applied or on the other electrode.

Two or more technologies to apply a pulse-like positive voltage as bias have been disclosed in order to suppress charging damage and local abnormal etching (i.e., notching) during the substrate processing.

BRIEF DESCRIPTION OF DRAWINGS

Aspects of this disclosure will become apparent upon reading the following detailed description and upon reference to accompanying drawings. The description and the associated drawings are provided to illustrate embodiments of the invention and not limited to the scope of the invention.

DESCRIPTION

As will be described below, according to an embodiment, a substrate processing method using a substrate processing apparatus includes a first step and a second step. The first step is to apply a negative voltage pulse from a pulsed power supply to be included in the apparatus. The second step is to apply floating potential for an interval of time between the negative voltage pulse and a positive voltage pulse from the pulsed power supply subsequent to the negative voltage pulse. In addition, the apparatus includes a chamber, a first electrode, a second electrode, an RF power supply, and the pulsed power supply. The first electrode is provided inside the chamber. The second electrode is provided so that the second electrode faces the first electrode to hold a substrate. The RF power supply applies an RF voltage having a frequency of 50 MHz or higher to the second electrode. The pulsed power supply repeatedly applies a voltage waveform with the RF voltage to the second electrode. The voltage waveform includes a negative voltage pulse and a positive voltage pulse.

According to another embodiment, a substrate processing apparatus includes a chamber, a first electrode, a second electrode, an RF power supply, and a pulsed power supply. The first electrode is provided inside the chamber. The second electrode is provided inside the chamber so that the second electrode faces the first electrode to hold a substrate. The RF power supply is to apply an RF voltage having a frequency of 50 MHz or higher to the second electrode. The pulsed power supply is to repeatedly apply a voltage having a waveform including a negative voltage pulse and a positive voltage pulse to the second electrode with the voltage superimposed on the RF voltage. In addition, the pulsed power supply includes a first power supply, a second power supply, an output terminal, a first switch, a second switch, a third switch, and a switching unit. The first power supply is to output a first voltage corresponding to a peak voltage of the negative voltage pulse. The second power supply is to output a second voltage corresponding to a peak voltage of the positive voltage pulse. To the output terminal, any one of the first voltage, the second voltage and ground potential is applied. The first switch is to switch a connection of the first power supply to the output terminal. The second switch is to switch a connection of the second power supply to the output terminal. The third switch is to switch a connection of the ground potential to the output terminal. The switching unit is to control the first switch, the second switch, and the third switch.

First Embodiment

1. Configuration of Substrate Processing Apparatus

Figure 1:
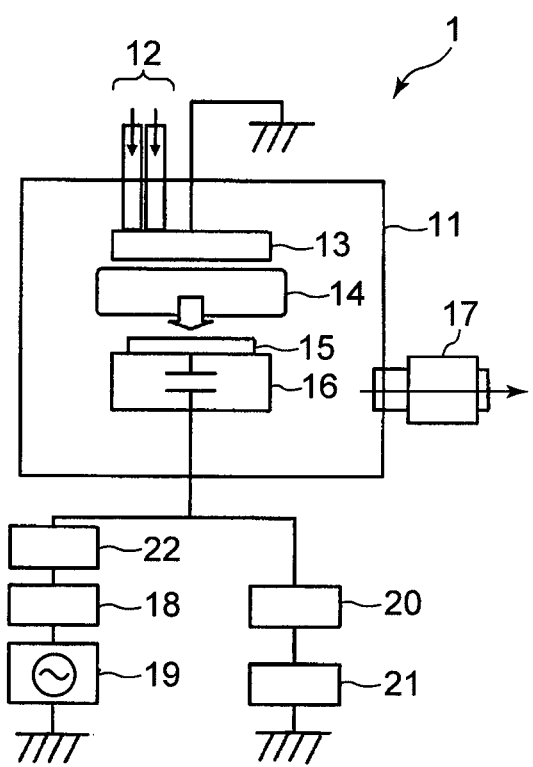
FIG. 1 is a schematic view showing a configuration of a substrate processing apparatus according to a first embodiment.

FIG. 1 is a schematic view showing a configuration of a substrate processing apparatus according to a first embodiment.

A substrate processing apparatus 1 is a reactive ion etching (RIE) apparatus of parallel-plate type. A wafer 15 is a processing object (i.e., a substrate) of the substrate processing apparatus 1. An etching chamber 11 maintains a function necessary for the processing of the wafer 15. A process gas introduction pipe 12 introduces a process gas necessary for the processing of the wafer 15. In addition to gases such as Ar, Kr, Xe, $N_2$, $O_2$, CO, and $H_2$, it is possible to appropriately utilize $SF_6$, $CHF_3$, $CH_3F$, $CF_4$, $C_2F_6$, $C_4F_8$, $C_5F_8$, $C_4F_6$, $Cl_2$, HBr, $SiH_4$, $SiF_4$, or the like.

A lower electrode 16 is provided with an electrostatic chuck to hold the wafer 15. An upper electrode 13 is provided to face an upper side of the lower electrode 16 and one terminal thereof is at ground potential (i.e., is grounded). The upper electrode 13 and the lower electrode 16 compose a pair of parallel-plate electrodes.

Plasma 14 is generated by RF power applied to the lower electrode 16. Ions forming the plasma 14 move in the arrow direction in FIG. 1, i.e., are incident on the wafer 15. The substrate processing apparatus 1 etches the wafer 15 using plasma 14.

An exhaust port 17 is connected to a pressure-regulating valve and an exhaust pump not shown. The gas in the etching chamber 11 is exhausted via the exhaust port 17 so that pressure in the etching chamber 11 is maintained constant. An RF power supply 19 generates an RF voltage to be applied to the lower electrode 16. The frequency of the RF voltage is 50 Hz or higher. A matching device 18 performs impedance matching between the RF power supply 19 and the plasma 14 to output the RF voltage to a high-pass filter (HPF) 22.

Figure 2:
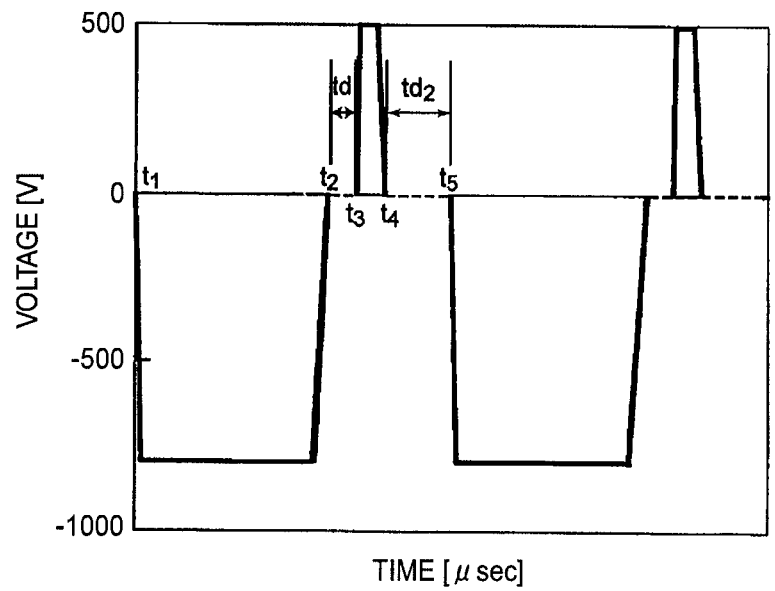
FIG. 2 is a view showing an example of a combination pulse waveform according to the first embodiment.

A pulsed-power supply circuit 21 outputs a voltage having a waveform shown in FIG. 2 (i.e., a combination pulse waveform) to a low-pass filter (LPF) 20. In the graph of FIG. 2, the vertical axis and the horizontal axis represent voltage (V) and time (µs), respectively.

As shown in FIG. 2, in the combination pulse waveform, a negative voltage pulse and a positive voltage pulse are combined and the circuit is opened for an interval of time between the applied voltage pulses (i.e., td being between t2 and t3 as shown by dotted line) to be at floating potential. That is, the positive pulse voltage, the negative pulse voltage and the floating potential are repeated periodically. Here, the negative voltage pulse and the positive voltage pulse have the respective rectangular voltage waveforms having approximately constant voltages (i.e., peak voltages) within one pulse. Details thereof will be described later.

Figure 3:
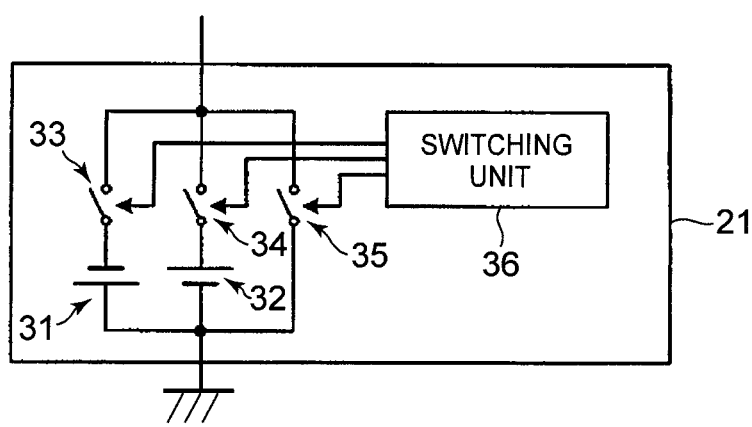
FIG. 3 is a schematic view showing an example of an inside configuration of a pulsed power supply of the substrate processing apparatus according to the first embodiment.

FIG. 3 is a schematic view showing an example of an internal configuration of the pulsed power supply 21. In this example, the pulsed power supply 21 is provided with DC power supplies 31, 32, switches 33 to 35, and a switching unit 36.

The DC power sources 31 and 32 are power sources for a negative voltage and a positive voltage, respectively. The DC power source 31 functions as a first power source having a first voltage corresponding to the peak voltage of the negative voltage pulse. The DC power source 32 functions as a second power source having a second voltage corresponding to the peak voltage of the positive voltage pulse.

The switches 33, 34, and 35 being controlled by the switching unit 36 are utilized to apply the negative voltage, the positive voltage, and the ground potential, respectively. The switch 33 functions as a first switch to switch a connection of the first power source to an output terminal. The switch 34 functions as a second switch to switch a connection of the second power source to the output terminal. The switch 35 functions as a third switch to switch a connection of the ground potential to the output terminal. Here, the switch 35 is not required if the ground potential is not utilized.

The switching unit 36 which controls switching of the switches 33 to 35 functions as a control unit to control the first to third switches. For example, when the switching unit 36 controls the combination of the switches 33 to 35 sequentially as (ON, OFF, OFF), (OFF, ON, OFF), and (OFF, OFF, ON) respectively, the negative voltage, the positive voltage, and the ground potential are applied to the output terminal of the pulsed power supply 21.

Further, when the switching unit 36 controls the combination of the switches 33 to 35 as (OFF, OFF, OFF), the output terminal of the pulsed power supply 21 is electrically floated from the power source unit to output the floating potential. In this case, a current from or into the plasma is blocked off.

In the present embodiment, the switching unit 36 controls the switches 33, 34, thereby allowing the pulsed power supply 21 to output a negative voltage pulse, floating potential, a positive voltage pulse, and floating potential at respective intervals of time between time t1 and t2, between time t2 and t3, between time t3 and t4, and between time t4 and t5 (i.e., time t1).

A truth table of operation of the switches 33, 34 in this case is shown in Table 1. Here, the switch 35 is not shown as the ground potential is not utilized.

TABLE 1

| | Operation | | | |
|---|---|---|---|---|
| Switch | Applying Negative Pulse | Floating td | Applying Positive Pulse | Floating td2 |
| Switch 33 | Close | Open | Open | Open |
| Switch 34 | Open | Open | Close | Open |

Here, LPF 20 outputs only low frequency components out of the voltage waveform inputted from the pulsed power supply 21 to the lower electrode 16 while preventing high frequency components from passing through the pulsed power supply 21 from the RF power supply 19. As a result, high frequency components from the RF power supply 19 and the combination pulse waveform from the pulsed power supply 21 are superimposed on each other to be applied to the lower electrode 16. Further, HPF 22 outputs only high frequency components out of the voltage waveform inputted from the RF power supply 19 to operate as well as LPF 20.

2. Operation of Substrate Processing Apparatus

Operation of the substrate processing apparatus configured as described above will be explained.

The wafer 15 is conveyed by a conveying mechanism (not shown) into the etching chamber 11 which is evacuated to reach a predetermined pressure. Next, the wafer 15 is held on the lower electrode 16 by the electrostatic chuck provided to the lower electrode 16.

Next, a process gas necessary for the processing of the wafer 15 is introduced via the process gas introduction pipe 12.

At that time, the process gas introduced into the etching chamber 11 is exhausted at a predetermined rate via the exhaust port 17 and the pressure regulating valve by the exhaust pump (not shown). As a result, the pressure in the etching chamber 11 is maintained constant.

Next, RF power is applied to the lower electrode 16 from the RF power supply 19 via the matching device 18 and HPF 22. Further, the combination pulse waveform shown in FIG. 2 is supplied from the pulsed power supply 21 via LPF 20 to be superimposed on the RF power, thereby applied to the lower electrode 16.

Here, it is preferable that the interval of time (i.e., dead time) td between the applying of a negative pulse and the applying of a positive pulse is small. However, it is difficult to completely eliminate the interval td for protecting the pulsed power supply from being broken as a result of a large current.

A plasma density is controlled by the RF power from the RF power supply 19. The incident energy of ions to be incident on the wafer 15 is controlled by the voltage of the negative voltage pulse from the pulsed power supply 21. The wafer 15 is etched by ions having a threshold energy value or more to perform the processing of the wafer 15.

In the above operation, various factors are to be examined for effective processing. Details about the factors will be described below.

A. Frequency of RF Voltage

As described above, the frequency of the RF power supply 19 is 50 MHz or higher. The reason thereof will be explained below. Setting the frequency of the RF power supply 19 to 50 MHz or higher has merits of the following (1) and (2).

(1) Control of Mean Incident Energy Vdc of Ions Only by Negative Voltage Pulse

As described above, the RF voltage and combination voltage pulses are superimposed on each other to be applied to the lower electrode 16. The plasma 14 is generated by the RF voltage between the lower electrode 16 and the upper electrode 13. Positive ions in the plasma 14 are incident on the wafer 15 to process the wafer 15. At that time, the mean incident energy Vdc of the positive incident ions is divided into a component Vdc1 due to the RF voltage and a component Vdc2 due to the negative voltage pulse.

Here, the component Vdc1 decreases with an increase in the frequency of the RF voltage. In particular, when the RF power is about 2.2 W/cm$^2$ or lower, the component Vdc1 becomes about 50 eV (i.e., a threshold value not to affect the processing of the wafer 15) or lower at an RF frequency exceeding 50 MHz. Further, when the RF power exceeds 2.2 W/cm$^2$, RF-power dependence of the component Vdc1 decreases extremely.

Accordingly, the mean incident energy Vdc becomes dependent only on the negative voltage pulse without being dependent on the RF voltage by setting the RF frequency to 50 MHz or higher. In other words, only the negative voltage pulse is capable of controlling the incident energy Vdc. As a result, the processing can be accurately performed with ions having narrow-band energy generated by the negative voltage pulse.

Here, applying the RF voltage to the lower electrode 16 is to generate plasma effectively. Even when an insulative film is deposited on the wafer 15, plasma is effectively generated, thereby allowing it to process the wafer 15.

(2) Narrowing Distribution of Incident Energy of Ions

As will be described below, increasing the frequency of the RF voltage allows it to process the wafer 15 effectively and accurately with ions having a substantially single-energy peak.

In general, the distribution of ion energy in the plasma 14 shows a low energy side peak PL and a high energy side peak PH. This is because the plasma 14 is generated by the RF voltage. The energy width ΔE between the peaks PL and PH depends on conditions to generate plasma, and is from several tens of eV to several hundreds of eV. Accordingly, even though the mean incident energy Vdc is adjusted to a value appropriate to the processing of the wafer 15, ions having too high energy (i.e., having high energy peak) and ions having too low energy (i.e., having low energy peak) are included in the ions incident on the wafer 15.

When the wafer 15 is processed with ions of which energy distribution has two peaks as described above, there is a possibility that the processing accuracy becomes insufficient. For example, when the wafer 15 is processed with ions having a high energy peak, there is a possibility that a shoulder of a processed groove is rounded (i.e., shoulder dropping occurs.) On the contrary, when the wafer 15 is processed with ions having a low energy peak, there is a possibility that the ions having energy lower than a surface reaction threshold value do not contribute to the processing or deteriorate "anisotropy" of processing as a result of thermal spread of the incident angle of the ions.

The energy width ΔEi decreases with an increase in the RF voltage frequency. Hence, increasing the RF voltage frequency up to 50 MHz or higher in particular narrows a distribution of incident energy of ions. As a result, the wafer 15 can be processed with ions having a substantially single energy peak. That is, ions having excessively high energy are not substantially generated by the RF voltage of which frequency is 50 MHz or higher.

B. Occurrence of charging at Groove Bottom etc.

Effects for applying a positive voltage pulse will be explained. At first, it is described that only a negative voltage pulse is applied without applying a positive voltage pulse.

Applying both the RF voltage and the negative voltage pulse (i.e., without applying the positive voltage pulse) causes charging in particular inside a groove when providing a deep shape (i.e., a deep groove or a deep hole) or a complicated shape (i.e., a three-dimensional shape) to an insulating film on the wafer 15. The charging inside the groove causes a decrease in processing accuracy of the groove. The reason of the charging will be explained below.

Figure 4:
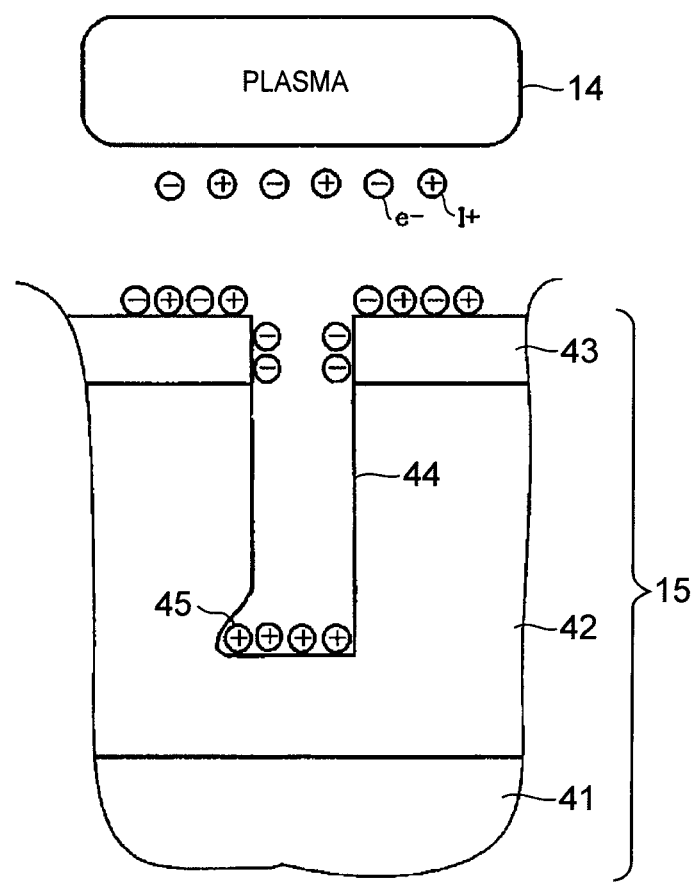
FIG. 4 is a sectional view showing a state of processing a wafer.

FIG. 4 is a sectional view showing processing of the wafer 15. Here, the wafer 15 is a laminated body of a substrate 41 and an insulating body 42. A groove 44 is formed by utilizing a mask 43. For example, Si, SiOC and Si$_3$N$_4$ (silicone nitride) can be utilized for the substrate 41, the insulating body 42, and the mask 43, respectively.

The plasma has positive ions I$^+$ and electrons e$^-$ both being incident on the substrate 41. Positive ions I$^+$ and electrons e$^-$ having the same numbers are incident on the surface of the substrate 41 exposed to the plasma outside the groove 44 within one cycle of the negative pulse. The positive ions I$^+$ and electrons e$^-$ have a tendency to be electrically neutralized. Meanwhile, there is a tendency that the inside surface of the groove 44 having a narrow width and a large aspect ratio is electrically charged. The positive ions I$^+$ and the electrons e$^-$ are eccentrically-distributed in the vicinity of the bottom of the groove 44 and on a side wall in the vicinity of the opening of the groove 44 to positively and negatively charge, respectively.

The reason why charging easily occurs on the inside surface of the groove 44 is that positive ions I$^+$ are "anisotropic" and electrons e$^-$ are "isotropic." Positive ions I$^+$ are accelerated in a direction toward the substrate 41 by the negative voltage pulse to move in an aligned direction (i.e., being anisotropic). Meanwhile, electrons e$^-$ move in random (i.e., being isotropic). The isotropic electrons e$^-$ hardly enter a deep recess of a narrow groove so that the side wall in the vicinity of the opening of the groove 44 is negatively charged. The negative charging functions to repel electrons e$^-$. As a result, electrons e$^-$ entering the bottom portion of the groove 44 decreases in number. Meanwhile, the bottom portion of the groove 44 is positively charged as a result of the entering of anisotropic positive ions I⁺. Here, as mentioned above, the positive voltage pulse is not to be applied.

Further, as a result of the positive charging occurred at the bottom portion of the groove 44, the number of positive ions I⁺ arriving at the bottom portion of the groove 44 decreases and trajectories of the positive ions I⁺ are to be bent. This causes processing to stop (i.e., etching stop) or causes a processed shape to have a defect such as notching 45 on a side face of the bottom portion of the groove 44. Accordingly, desired processing becomes difficult to perform.

The negative voltage pulses are applied to the lower electrode 16 to make positive ions I⁺ be incident on the substrate 41, while the negative voltage pulses cause charging at the bottom portion of the groove 44. In order to relax the charging distribution balanced in the above state, the charging can be reduced by decreasing an ion current toward a bottom portion of a groove (or hole), increasing an electron current toward the groove (or the hole), or setting a period not to apply the negative voltage pulse to the lower electrode 16 (i.e., a break period of time). However, a decrease in the ion current causes a decrease in processing rate. Further, applying no negative voltage pulse also causes a decrease in the processing rate because a long break period to apply no negative voltage pulse is required in relation to a time constant to relax a charge imbalance. A method to relax the charge imbalance is to supply an electron current to the base of the groove (hole), thereby making it necessary to apply a positive voltage to the wafer and to generate the anisotropic electrons.

C. Relaxation of Charging by Applying Positive Voltage Pulse (Generation of Anisotropic Electrons)

It becomes possible to reduce charging in a short time by applying a positive voltage pulse in addition to a negative voltage pulse.

Figure 5:
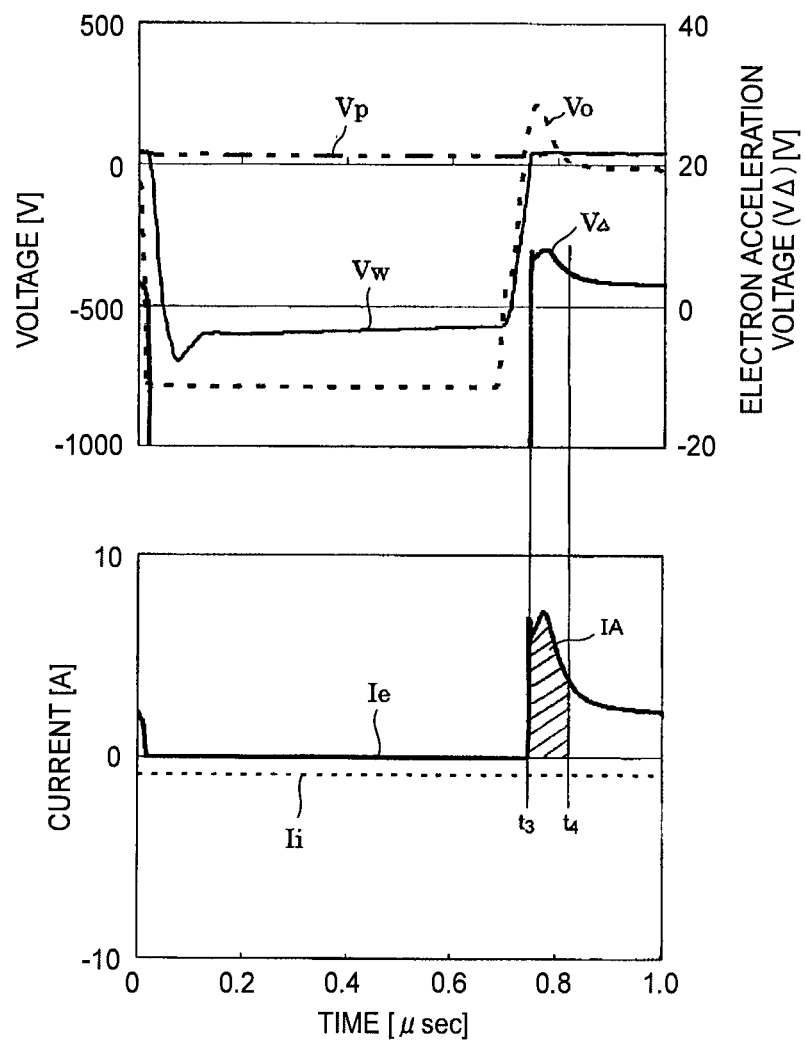
FIG. 5 is a graph showing an example of temporal variation of voltage and current.

FIG. 5 is a view showing a variation of voltage and current in the wafer when applying a positive pulse, explaining an effect to relax charging by applying the positive pulse.

FIG. 5 shows an example of a simulation where negative and positive voltage pulses are applied cyclically to the electrode 16, providing a calculation of a voltage and a current over one cycle of the application.

The simulation conditions are assumed to be the followings:
a pulse period is 1.0 μs;
the voltage of a negative voltage pulse is −800V;
the pulse width of the negative voltage pulse is 0.7 μs;
the voltage of a positive voltage pulse is +300V;
the pulse width of the positive voltage pulse is 0.06 μs;
the time interval td between the negative voltage pulse and positive voltage pulse is 10 ns;
the diameter of the wafer is 300 mm;
the electron density of the plasma is $1 \times 10^{17}/m^3$; and
the electron temperature of the plasma is 3 eV.
In addition, a simulation is carried out as a plasma circuit using "PSpice."
The simulation shown in FIG. 5 is obtained by inputting timing of the switching unit, negative and positive voltage pulses to a pulse-applying circuit to which a plasma-equivalent circuit is added under the above simulation conditions.

The upper part of FIG. 5 shows a pulse output voltage V0 from the pulsed power supply 21, a voltage Vw on the wafer held by the electrostatic chuck, and plasma potential Vp which have been calculated separately. The lower part of FIG. 5 shows a current (i.e., electron current Ie and ion current Ii) passing through the wafer. Further, the upper part of FIG. 5 shows an electron acceleration voltage VΔ which is the difference (i.e., Vw−Vp) between the voltage Vw on the wafer held by the electrostatic chuck and the plasma voltage Vp to be read on the basis of the right side scale.

Applying the positive voltage pulse having a small pulse width shortens the interval of time to apply the positive voltage pulse to generate an electron acceleration voltage VΔ ranging from several volts to several tens of volts. The electron acceleration voltage VΔ produces accelerated anisotropic electrons in the integral value IA of the electron current shown in the lower part of FIG. 5 so that the accelerated anisotropic electrons are incident on the wafer.

The integral value itself of the electron current to be determined by the ion current, i.e., a plasma state does not vary largely even when the positive voltage pulse is applied. Accordingly, an index is needed to evaluate a contribution to a reduction in the charging at the bottom portion of a groove or a hole. Effective electric energy Ee and effective electric power Pe(t) are defined as indexes to reduce the charging by utilizing a product of an acceleration voltage indicating the anisotropy and an electron current, i.e., the number of incident electrons per unit time.

[Equation 1]

$$Pe(t)[W] = Ie(t) \times (Vw(t) - Vp(t)) \qquad (1)$$

[Equation 2]

$$Ee[J] = \int_{t1}^{t2} Pe(t) dt \qquad (2)$$

Here, t1 denotes a start time to apply a positive voltage pulse, t2 denotes a time to end the application, and Ie(t) denotes an electron current.

D. Floating Potential Effect When Applying Positive Voltage Pulse

The effective electric power Pe(t) of the present embodiment is evaluated with the above equations (1), (2) when utilizing the voltage waveform (i.e., the pulse waveform) shown in FIG. 2.

Figure 6:
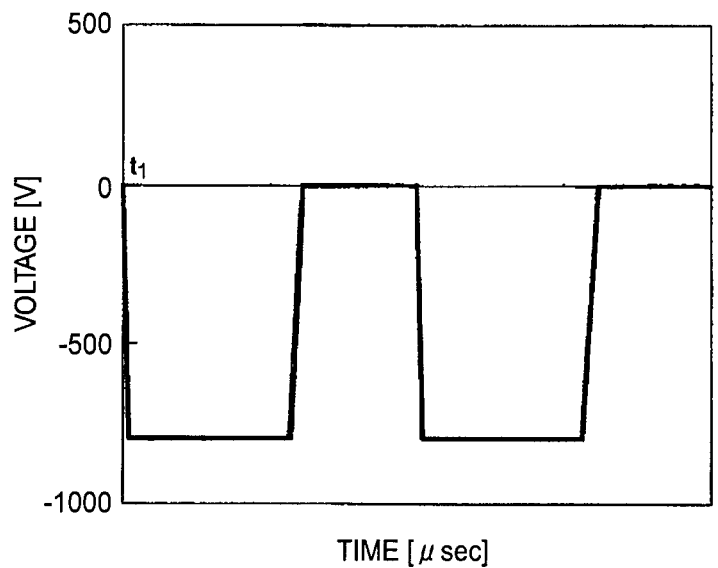
FIG. 6 is a view showing an example of the combination pulse waveform.
Figure 7:
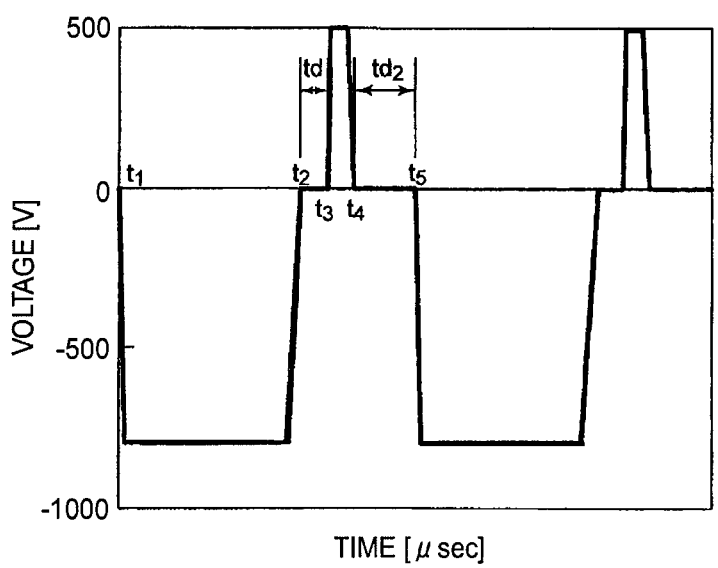
FIG. 7 is a view showing an example of the combination pulse waveform.

Here, the evaluation indexes are calculated for a voltage waveform (shown in FIG. 6 to follow a truth table for switching operation in Table 2) without applying the positive voltage pulse and for a voltage waveform (shown in FIG. 7 to follow a truth table for switching operation in Table 3) having ground potential for an interval of time between the negative voltage pulse and the positive voltage pulse. Then, the evaluation indexes for the two voltage waveforms are compared with the present embodiment.

TABLE 2

| | Operation | |
|---|---|---|
| Switch | Applying Negative Pulse | Ground td |
| Switch 33 | Close | Open |
| Switch 34 | Open | Open |
| Switch 35 | Open | Close |

TABLE 3

| | Operation | | | |
|---|---|---|---|---|
| Switch | Applying Negative Pulse | Ground td | Applying Positive Pulse | Ground td2 |
| Switch 33 | Close | Open | Open | Open |
| Switch 34 | Open | Open | Close | Open |
| Switch 35 | Open | Close | Open | Close |

Figure 8A:
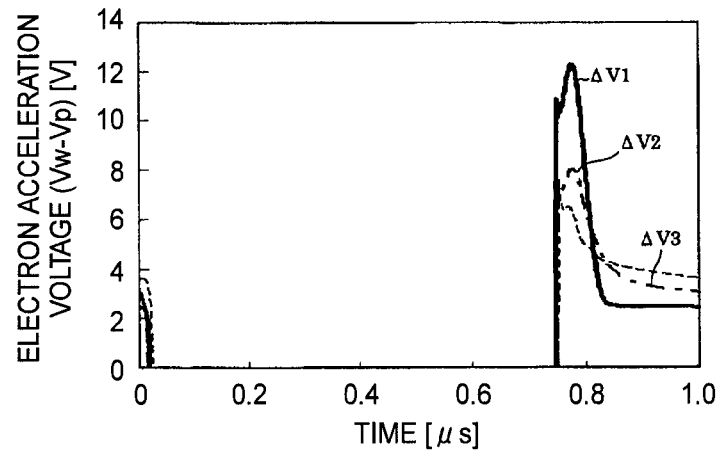
FIGS. 8A to 8C are graphs showing examples of temporal variation of electron acceleration voltage, electron current and effective electric power, respectively.
Figure 8B:
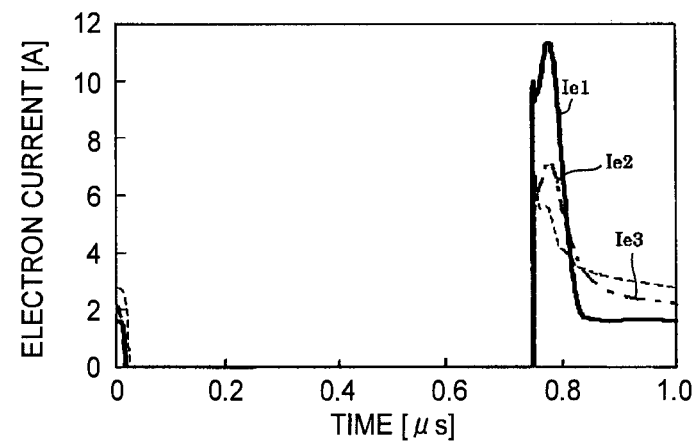
Figure 8C:
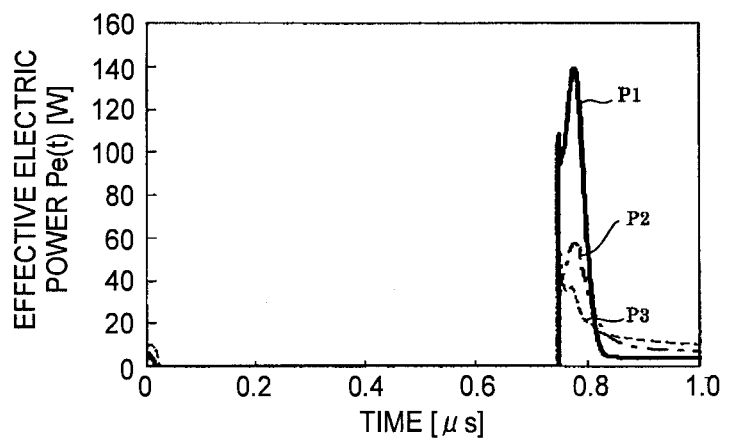

FIGS. 8A to 8C show calculations due to the above simulation and equations (1), (2) by utilizing the above three patterns of voltage waveforms. FIG. 8A shows a change in the electron acceleration voltage (VΔ=Vw−Vp) with time. FIG. 8B shows a change in the electron current with time. FIG. 8C shows a change in the effective electric power Pe(t) with time. In FIGS. 8A to 8C, the electron acceleration voltage, the electron current, and the effective electric power are denoted by VΔ1, Ie1, and P1, respectively, when the negative and positive voltage pulses are applied with floating potential set for an interval of time between the negative and positive voltage pulses. In FIGS. 8A to 8C, the electron acceleration voltage, the electron current, and the effective electric power are denoted by VΔ2, Ie2, and P2, respectively, when the negative and positive voltage pulses are applied with ground potential set for an interval of time between the negative and positive voltage pulses (Table 3 and FIG. 7). In FIGS. 8A to 8C, the electron acceleration voltage, the electron current, and the effective electric power are denoted by VΔ3, Ie3, and P3, respectively, when only the negative voltage pulse is applied without the positive voltage pulse (Table 2 and FIG. 6).

As shown in FIGS. 8A to 8C, all the values (VΔ2, Ie2, P2) are larger than the all values (VΔ3, Ie3, P3). Applying the positive and negative voltage pulses with floating potential set for an interval of time between the negative voltage pulse and the positive voltage pulse in the present embodiment allows the electron acceleration voltage VΔ1 and the electron current Ie1 to further increase. As a result of an increase in the electron acceleration voltage and the electron current, the effective electric power P1 due to anisotropic electrons increases remarkably.

That is, regarding the effective electric energy Ee per cycle, P1 (integrated area), P2 (integrated area) and P3 (integrated area) are $6.5 \times 10^{-3}$ [J], $3.6 \times 10^{-3}$ [J] and $2.1 \times 10^{-3}$ [J], respectively. According to the present embodiment, it is possible to provide a substrate-processing method and a substrate-processing apparatus capable of increasing effective electric power by about 80% in comparison with the integrated areas of P1 and P3 to perform effective processing.

F. Dead Time Dependence

Figure 9A:
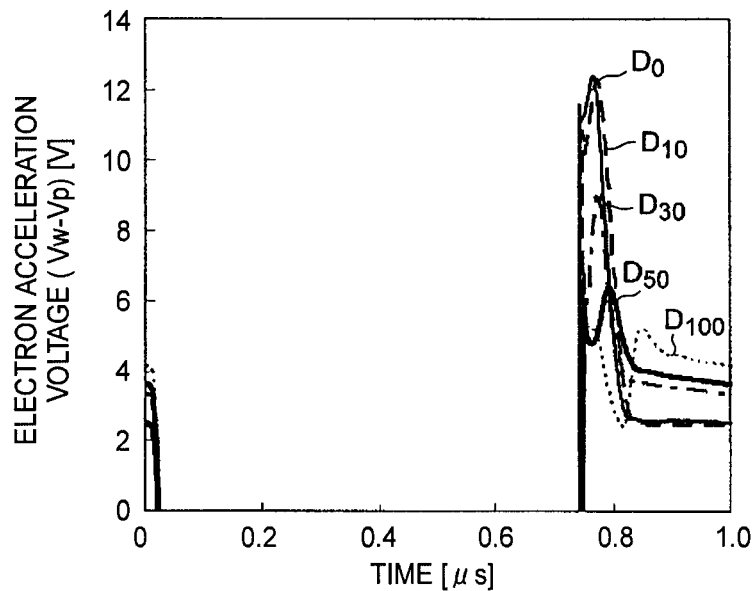
FIGS. 9A to 9B are graphs showing examples of temporal variation of electron acceleration voltage and effective electric power, respectively.
Figure 9B:
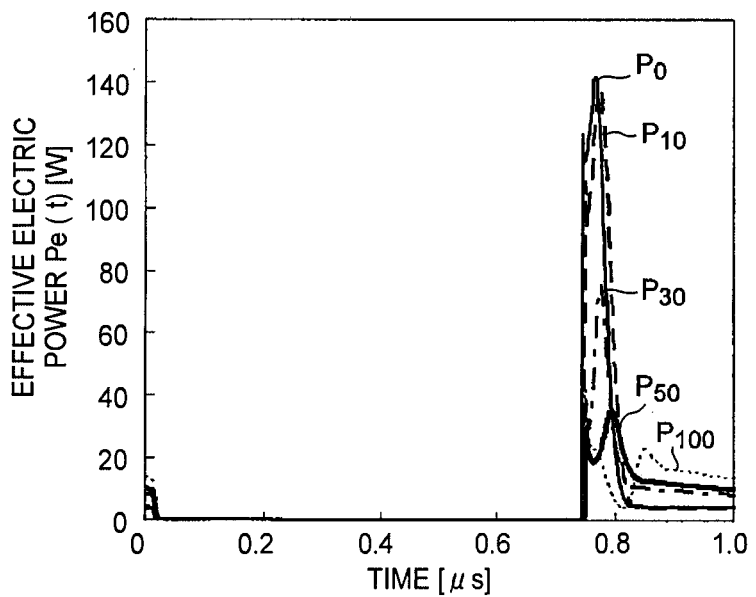

The dependence on dead time of which interval allows the floating potential to be outputted (i.e., called the dead time td) is examined under the conditions of the present embodiment. In FIG. 2, floating potential is outputted for an interval of td (i.e., between t2 and t3). The electron acceleration voltage VΔ (i.e., Vw−Vp) and the effective electric power Pe(t) vary depending on the length of the dead time td. FIGS. 9A and 9B are views showing a relation between the dead time td and the electron acceleration voltage, and a relation between the dead time td and the effective electric power Pe(t), respectively.

FIGS. 9A and 9B show a simulation of the electron acceleration voltage (i.e., D0, D10, D30, D50, D100) per cycle and a simulation of the effective electric power (P0, P10, P30, P50, P100), respectively, with changing the dead time td (e.g., td=0 ns, 10 ns, 30 ns, 50 ns, 100 ns).

As can be seen from FIGS. 9A and 9B, the electron acceleration voltage and the effective power decrease with an increase in the dead time td. The effective electric energy for dead time td of 50 ns or longer (i.e., the effective electric power P50, P100) decreases significantly down to about one sixth compared to the effective electric energy for dead time td of 0 ns to 10 ns (i.e., the effective electric power P0, P10). Accordingly, it can be seen that shorter dead time td is preferable for the effective electric energy not to be decreased.

Figure 10A:
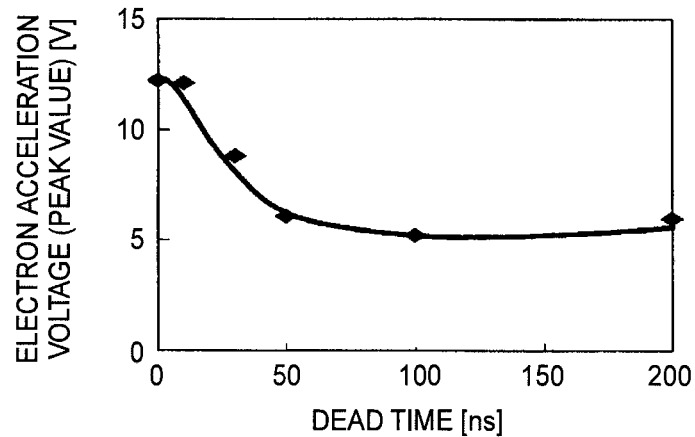
FIGS. 10A to 10C are graphs showing examples of dependency to dead time of electron acceleration voltage, effective electric energy and negative voltage on a wafer, respectively.
Figure 10B:
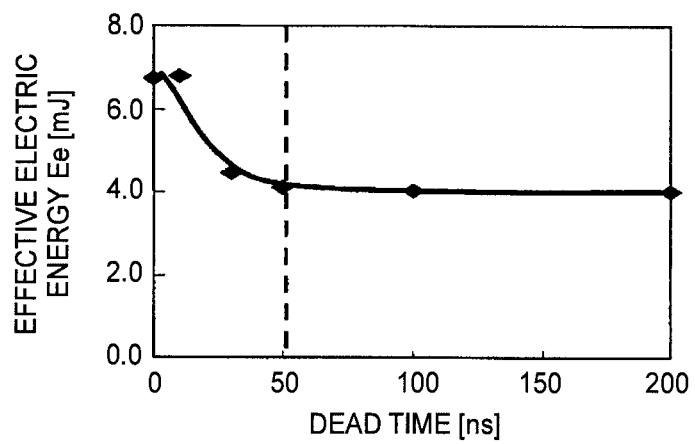
Figure 10C:
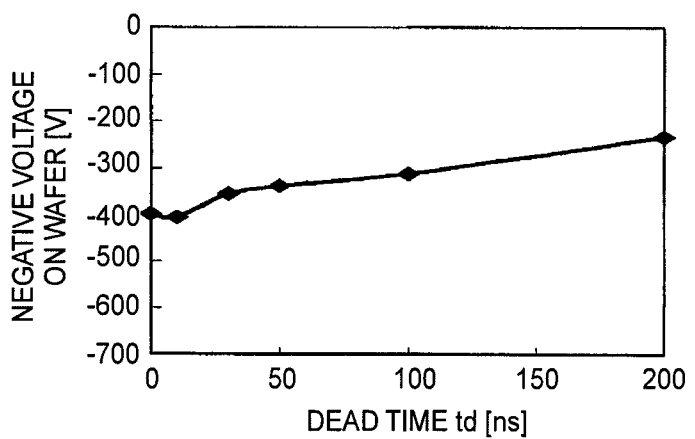

FIG. 10A is a graph showing a peak value of an electron acceleration voltage. FIG. 10B is a graph showing the effective electric power Ee [mJ]. FIG. 10C is a graph showing a negative pulse voltage value on the wafer, respectively at each dead time td. It can be seen that every value varies depending on the dead time. In particular, according to FIG. 10B, the effective electric energy increases with decreasing the dead time, and then, the effective electric energy becomes saturated when the dead time td is larger than 50 ns.

As mentioned above, the electron acceleration voltage (FIG. 9A) and the effective electric energy (FIG. 10B) being taken into account, it is preferable to set the dead time as short as possible in a point of processing efficiency. However, when the influence of the dead time on relaxation of the charging is taken into account, it is preferable to set the dead time to 50 ns or less for the trade-off between the relaxation of the charging and the processing efficiency. Also in a point of increasing the negative voltage pulse, the dead time is preferably set to 50 ns or less.

In this way, the floating potential time (i.e., the dead time td) is set to 50 ns or less to allow it to perform more efficient processing.

Second Embodiment

A second embodiment will be explained below. Here, the same numerals denote the same structures or the like as well as in the first embodiment and the explanations thereof will not be repeated.

Figure 11:
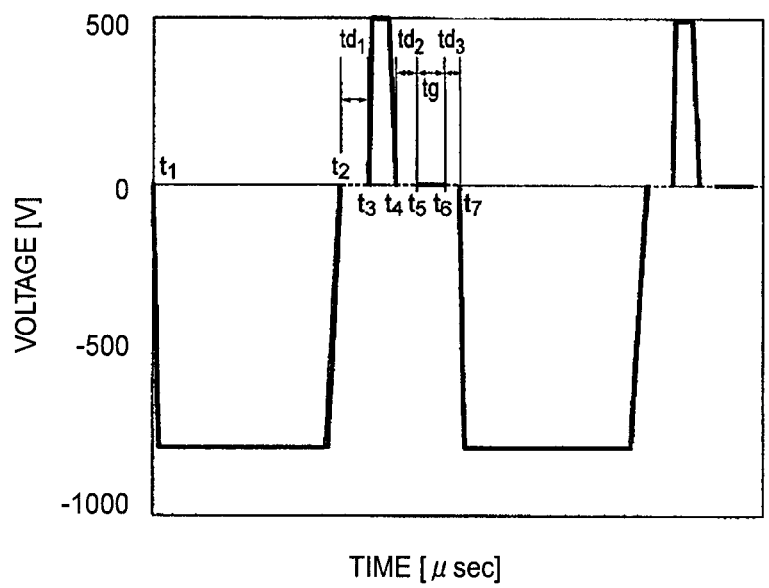
FIG. 11 is a view showing an example of a combination pulse waveform according to a second embodiment.

In the second embodiment, an apparatus configuration is the same as that of the first embodiment shown in FIGS. 1 and 3. The voltage waveform (i.e., the combination pulse waveform) outputted from the pulsed power supply circuit 21 is different from that of the first embodiment. FIG. 11 is a graph showing the voltage waveform. In the graph of FIG. 11, the vertical axis and the horizontal axis represent voltage (V) and time (μs), respectively. A truth table for operation of the switches 33, 34, 35 in the pulsed power supply circuit 21 is shown in Table 4 in accordance with the voltage waveform.

TABLE 4

| | Operation | | | | | |
|---|---|---|---|---|---|---|
| Switch | Applying Negative Pulse | Floating td | Applying Positive Pulse | Floating td2 | Ground | Floating td3 |
| Switch 33 | Close | Open | Open | Open | Open | Open |
| Switch 33 | Open | Open | Close | Open | Open | Open |
| Switch 33 | Open | Open | Open | Open | Close | Open |

In the above tables 1 to 4, "Open" means an open circuit corresponding to "switch off", whereas "Close" means a closed circuit corresponding to "switch on."

As shown in FIG. 11, the pulsed power supply 21 outputs a negative voltage pulse, floating potential, a positive voltage pulse, floating potential, ground potential, and floating potential for respective intervals of time between time t1 and t2, between time t2 and t3 (i.e., td1), between time t3 and t4, between time t4 and t5 (i.e., td2), between time t5 and t6 (i.e., tg), and between time t6 and t7 (i.e., td3) to form a desired pulse waveform.

Effects of outputting such a pulse waveform will be explained below.

Figure 12:
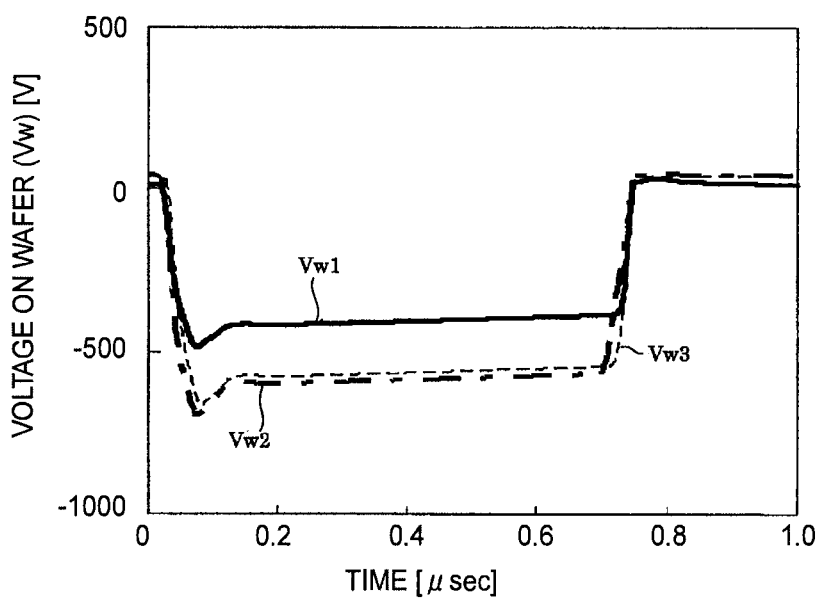
FIG. 12 is a graph showing an example of temporal variation of voltage on a wafer.

FIG. 12 is a graph showing voltages on the wafer when utilizing the above three patterns of voltage waveforms. FIG. 12 shows time changes in the voltages Vw1, Vw2, and Vw3 on the wafer. The voltage Vw1 on the wafer is generated by applying the positive voltage pulse and setting the floating potential between the negative voltage pulse and the positive voltage pulse (i.e., the pulse voltage waveform shown in FIG.

2). The voltage Vw2 on the wafer is generated by applying only the negative voltage pulse without the positive pulse (i.e., the pulse waveform shown in FIG. 6). The voltage Vw3 on the wafer is generated by applying the positive voltage pulse and setting the ground potential between the negative voltage pulse and the positive voltage pulse (i.e., the pulse waveform shown in FIG. 7).

Here, although the pulsed power supply 22 outputs a voltage of −800V, about −600V is applied as Vw2 and Vw3 on the wafer. This is because a voltage absolute value on the wafer decreases from −800V to −600V through the impedance to be involved by the electrostatic chuck of the lower electrode 16. Further, the negative bias voltage decreases down to −400V regarding Vw1. This is because the bias potential decreases as a result of the shortage of an electron current. The shortage means that the electron current is smaller than the ion current in one cycle of the bias when the floating potential time becomes long. Vw1 is adjusted lower to keep the balance between the electron current and the ion current. Accordingly, the long floating potential time causes etching rate to decrease, which is not preferable for the processing.

In order to improve this problem, the second embodiment utilizes a pulse waveform in which a part of the time after applying the positive pulse is allocated to the applying of the ground potential as shown in FIG. 12. In the following, time dependence of the ground potential will be examined.

Figure 13:
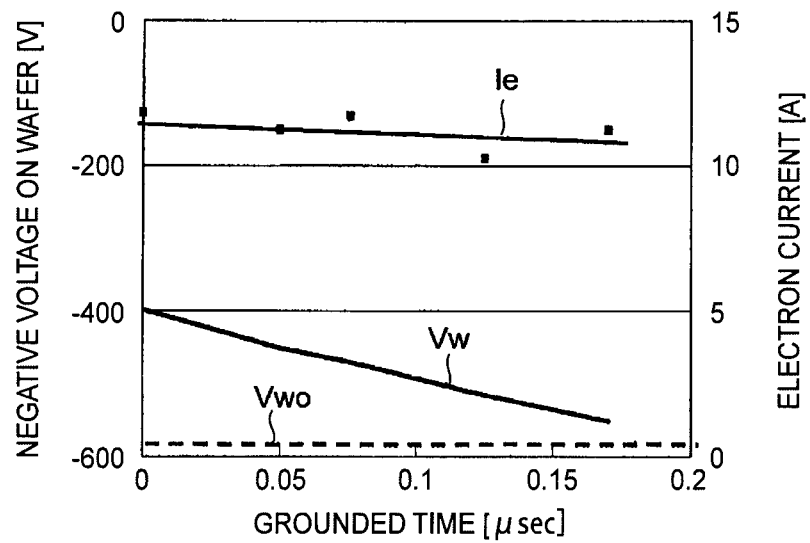
FIG. 13 is a graph showing an example of dependency to grounded time of the voltage on the wafer and the electron current.

FIG. 13 is a graph showing a simulation of the negative pulse voltage Vw on the wafer and the electron current maximum value Ie both varying with the grounded time (i.e., the time tg between t5 and t6 in FIG. 11). Further, the voltage Vw0 on the wafer involving no positive pulse (i.e., the pulse waveform in FIG. 6) to be applied is also shown for comparison in FIG. 13. Here, both td1 and td2 are set to 10 ns and the td3 is to be 220−tg (ns) with varying the time tg from 0 to 200 ns. The other parameters are the same as those in the first embodiment.

In FIG. 13, when the grounded time tg becomes long, the voltage Vw on the wafer decreases (i.e., the absolute value thereof is to increase) down to the voltage Vw0 on the wafer involving the positive pulse to be applied, while the electron current Ie undergoes very little change.

That is, the intervals of time for the floating potential (as td2: t4 to t5), the ground potential (as tg: t5 to t6), and the floating potential (as td3: t6 to t7) are provided in this order subsequent to the positive pulse (t3 to t4) applied, thereby allowing it to increase the absolute values of the voltages on the wafer. This enhances processing efficiency to add a further effect to the effects of the first embodiment.

Here, the longer the interval of the grounded time tg is, the more the absolute values of the voltages on the wafer increase. Therefore, it is preferable to set the dead time td2, td3 as short as possible and to set the other dead time substantially to the ground potential after applying the positive voltage pulse if apparatus constraints allow.

Other Embodiments

Other embodiments will be explained below.

1. Configuration of Pulsed Power Supply

The present embodiment differs from the first and second embodiments only in that the pulsed power supply circuit 21 shown in FIG. 3 is replaced by a pulsed power supply circuit using a diode. Any components other than the pulsed power supply circuit of the present embodiment are the same as those of the first and second embodiments.

A method using a diode is employed as a method to output ground potential from the pulsed power supply circuit. The pulse circuit can employ a circuit configuration omitting a switch for the ground potential as only an electron current can flow in the direction from the power supply terminal toward the plasma without a positive pulse current (i.e., ion current). That is, a high-speed diode enabling high-speed response can be utilized instead of the switch for the ground potential.

Figure 14:
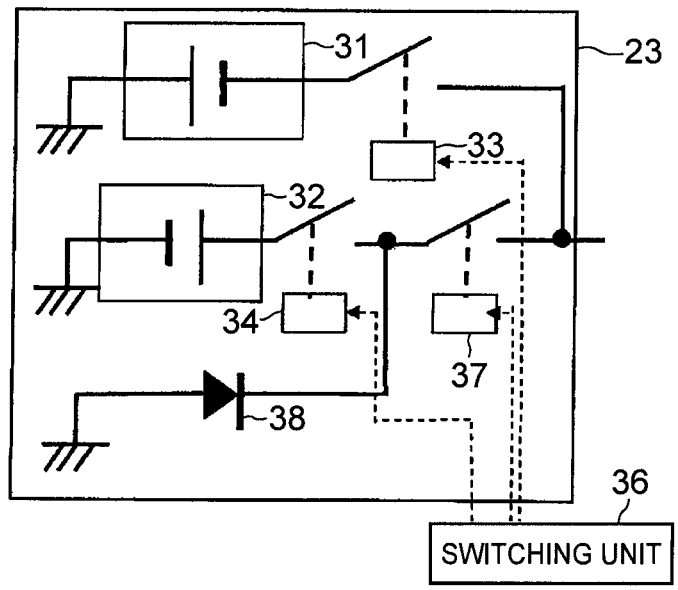
FIG. 14 is a schematic view showing an example of an inside configuration of a pulsed power supply of another embodiment.

FIG. 14 is a diagram showing an example of the pulsed power supply circuit 23 using a diode according to the present embodiment. Here, a diode 38 is provided to the grounding portion in the pulsed power supply circuit 23. Three switches are operated by the switching unit 36 as well as in the pulsed power supply circuit 21 shown in FIG. 3. The dead time for switching from the switch 34 to the switch 35 in the pulsed power supply circuit 21 shown in FIG. 3 becomes unnecessary as a short current from the positive pulsed power supply 32 to the ground is blocked off by the diode 38.

That is, it is possible to set the dead time (i.e., td2 in FIG. 11) for switching from the positive voltage pulse to the ground potential substantially to be 0ns in the pulse waveform in FIG. 11 of the second embodiment.

In this way, the dead time t2 can be eliminated practically to allow it to set a long grounded time after the positive pulse is applied subsequently to the negative voltage pulse. Accordingly, efficient processing is enabled.

Figure 15:
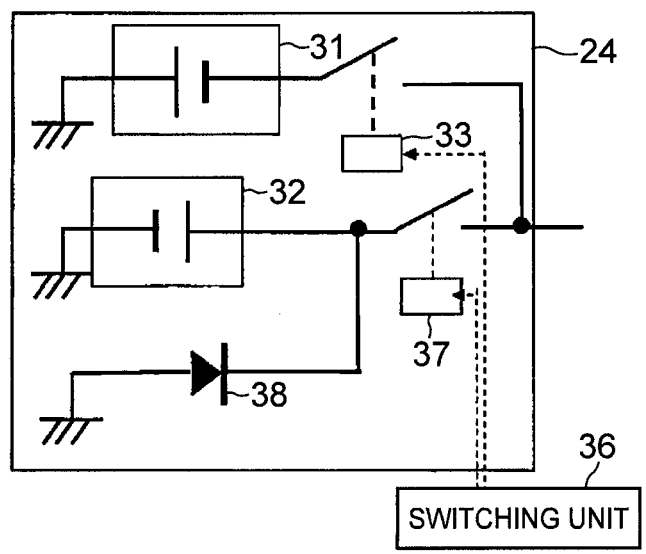
FIG. 15 is a schematic view showing an example of an inside configuration of a pulsed power supply of another embodiment.

Further, it is also possible to omit the switch 34 as well as in a pulsed power supply circuit 24 shown in FIG. 15.

Figure 16:
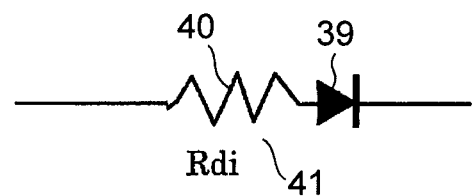
FIG. 16 is a circuit diagram showing a resistance-provided diode.

Alternatively, a resistance-connected diode 41 may be employed as the diode 38. The resistance-connected diode 41 has a resistance 40 connected serially to a high-speed diode 39 shown in FIG. 16, thereby allowing it to control an electron current and a negative pulse voltage by adjusting the resistance value Rdi of the resistance 40.

Figure 17:
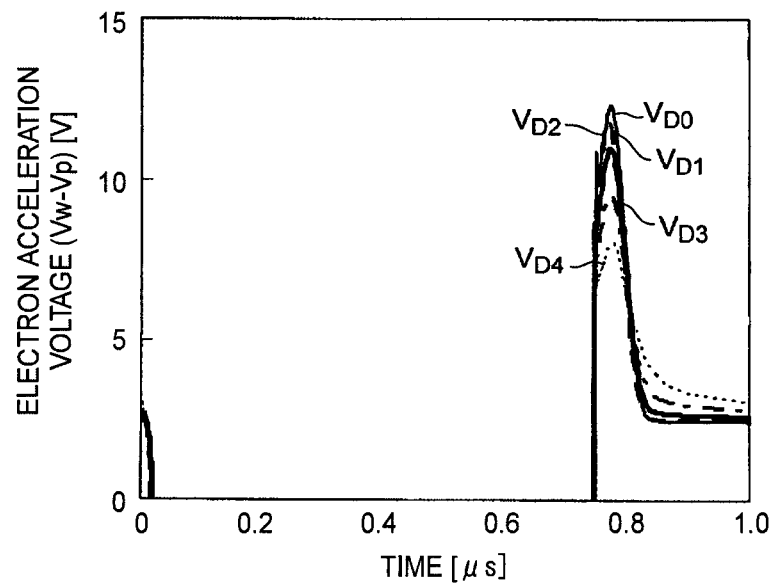
FIG. 17 is a graph showing an example of temporal variation of electron acceleration voltage.

FIG. 17 is a graph showing a simulation when utilizing the resistance-connected diode 41 in the circuit of FIG. 14 as well as in the first embodiment.

FIG. 17 also shows changes in the electron acceleration voltages (VD1, VD2, VD3, VD4) with time when varying the resistance values R (100, 50, 10, and 0.1Ω) respectively, and a change in the electron acceleration voltage (VD0) with time when utilizing no diode. Increasing the resistance value makes the electron acceleration voltages approach VD0 when utilizing no diode. Utilizing the resistance Rdi having a resistance value of 10Ω to 50Ω increases the electron acceleration voltage on the wafer to allow the electron current to increase as a result of parallel-plate plasma having an impedance of 10Ω to 50Ω.

2. Multiplexing of Pulse Waveform

Further, it is also possible to apply a negative voltage pulse and a positive voltage pulse two or more times for a short interval of time in the pulse waveform of the first and second embodiments.

Figure 18:
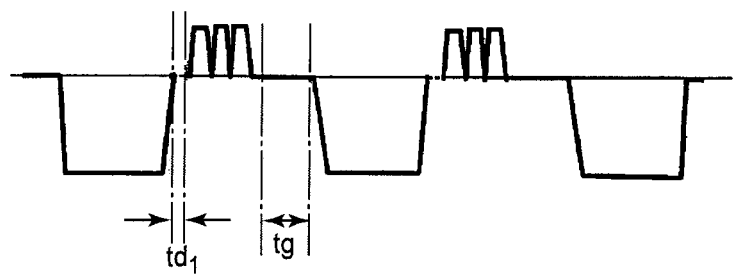
FIG. 18 is a view showing an example of a combination pulse waveform according to another embodiment.
Figure 19A:
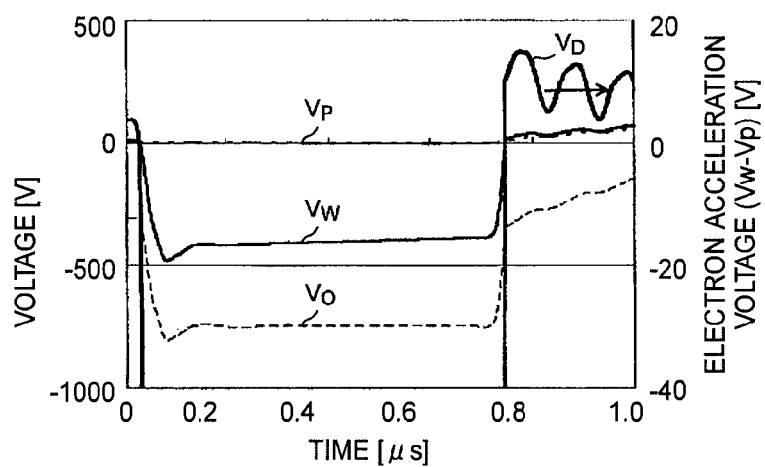
FIGS. 19A to 19C are graphs showing examples of temporal variation of electron acceleration voltage, electron current and effective electric power, respectively.
Figure 19B:
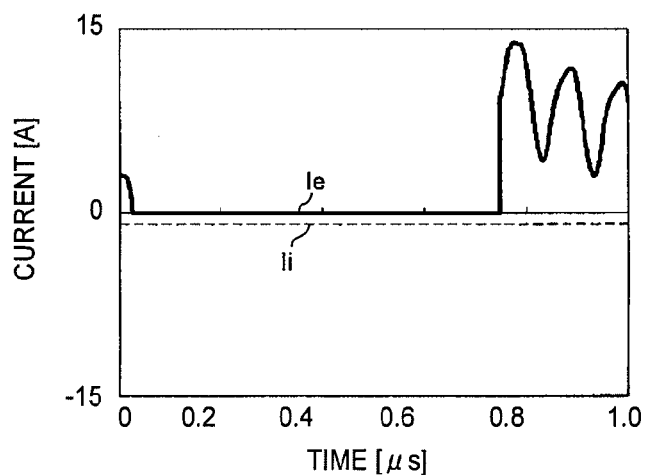
Figure 19C:
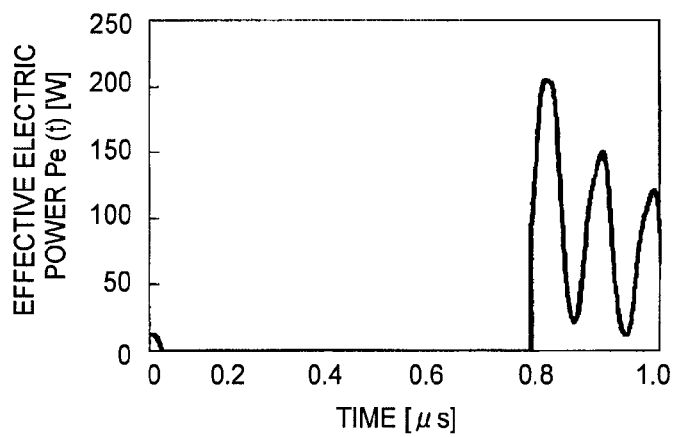

FIG. 18 is a view showing a pulse voltage waveform to apply two or more positive voltage pulses after applying a negative voltage pulse. FIGS. 19A to 19C show simulations when applying three positive voltage pulses per cycle as shown in FIG. 18 and as well as in the first embodiment.

FIG. 19A shows a pulsed output voltage V0 from the pulsed power supply 21, a voltage Vw on the wafer held by the electrostatic chuck, and plasma potential Vp. FIG. 19B shows a current passing through the wafer (i.e., the electron current Ie and the ion current Ii). FIG. 19C shows a variation in the effective electric power with time.

As shown in FIGS. 19A to 19C, the electron current increases more by applying three positive voltage pulses than by applying just one positive voltage pulse as a result of an increase in the anisotropic electrons. Applying two or more positive voltage pulses per cycle is effective to relax the charging.

The dead time td to change from the application of a negative voltage pulse to the application of a positive voltage pulse is set to 50 ns for floating potential. A time interval tg for a grounded potential is provided between a positive voltage pulse and a subsequent negative voltage pulse next to the positive voltage pulse. Under the time condition of these td and tg, applying two or more positive voltage pulses (floating potential between two positive voltage pulses) decreases the response pulses slightly in the order of the first response pulse, the second one, and the third one in the electron current or the effective electric power, but generates the electron current or the effective electric power to a large extent. When integrating the response pulses of the electron current and the effective electric power over one cycle, the integrated electron current and the integrated effective electric power reach sufficient values to relax the charging.

Figure 20:
FIG. 20 is a view showing an example of a combination pulse waveform according to another embodiment.

Alternatively, two or more negative voltage pulses and a single positive voltage pulse may be combined with each other. The alternative example is shown in FIG. 20. The negative voltage pulses are continuously applied and a positive voltage pulse is applied during a time interval to suspend the continuous application of the negative voltage pulses. In FIG. 20, an RF voltage is superimposed.

Further, it is effective to repeat the combination application of the positive and negative voltage pulses with an appropriate time interval of floating potential or a grounded potential inserted during the repetitions, instead of the continuously applied negative voltage pulses.

Here, in order to relax accumulated charges, it is also effective to repeat the following steps:
applying two or more negative voltage pulses;
setting floating potential for 50 ns or shorter during the dead time before applying a positive voltage pulse;
setting a grounded potential during a time interval after applying a positive voltage pulse; and
applying at least one positive voltage pulse.

The present invention not being limited directly to the above embodiments is enabled with modification of structural elements without departing from the scope thereof in the reduction to practice. For example, the present invention can be applied to not only an RIE, but also a plasma chemical vapor deposition (CVD) apparatus or the like as a substrate processing apparatus.

While a certain embodiment of the invention has been described, the embodiment has been presented by way of examples only, and is not intended to limit the scope of the inventions. Indeed, the novel elements and apparatuses described herein may be embodied in a variety of other forms; furthermore, various omissions, substitutions and changes in the form of the methods described herein may be made without departing from the spirit of the invention. The accompanying claims and their equivalents are intended to cover such forms or modifications as would fall within the scope and spirit of the invention.

What is claimed is:

1. A substrate processing method using a substrate processing apparatus, comprising:
a first step of applying a negative voltage pulse from a pulsed power supply included in the apparatus; and
a second step of applying a floating potential for an interval of time between the negative voltage pulse and a positive voltage pulse from the pulsed power supply subsequent to the negative voltage pulse,
wherein the apparatus includes:
a chamber;
a first electrode provided inside the chamber;
a second electrode provided inside the chamber so that the second electrode faces the first electrode and to hold a substrate;
an RF power supply to apply an RF voltage having a frequency of 50 MHz or higher to the second electrode; and
the pulsed power supply to repeatedly apply a voltage waveform with the RF voltage to the second electrode, the voltage waveform including a negative voltage pulse and a positive voltage pulse, the pulsed power supply including a first power supply to output a first voltage corresponding to a peak voltage of the negative voltage pulse, a second power supply to output a second voltage corresponding to a peak voltage of the positive voltage pulse, a ground terminal to provide a ground potential, and an output terminal to which any one of the first power supply, the second power supply, and the ground terminal is applied, and the floating potential being applied to the second electrode between applying the negative voltage pulse and the positive voltage pulse by disconnecting the output terminal of the pulsed power supply from the first power supply, the second power supply, and the ground terminal.

2. The substrate processing method according to claim 1, further comprising:
applying a ground potential for an interval of time between the positive voltage pulse and the negative voltage pulse subsequent to the positive voltage pulse, both the negative pulse voltage and the positive pulse voltage being outputted by the pulsed power supply.

3. The substrate processing method according to claim 1, wherein an interval of time to output the floating potential is 50 ns or shorter.

4. A substrate processing method using a substrate processing apparatus, comprising:
a first step of applying a negative voltage pulse from a pulsed power supply included in the apparatus; and
a second step of applying a floating potential for an interval of time between the negative voltage pulse and a positive voltage pulse from the pulsed power supply subsequent to the negative voltage pulse;
wherein the apparatus includes:
a chamber;
a first electrode provided inside the chamber;
a second electrode provided inside the chamber so that the second electrode faces the first electrode and to hold a substrate;
an RF power supply to apply an RF voltage having a frequency of 50 MHz or higher to the second electrode; and
the pulsed power supply to repeatedly apply a voltage waveform with the RF voltage to the second electrode, the voltage waveform including the negative voltage pulse and the positive voltage pulse;
wherein under a state of applying the floating potential from the pulsed power supply, an output terminal of the pulsed power supply is opened to block off a current from and to the second electrode.

5. The substrate processing method according to claim 4, further comprising:
applying a ground potential for an interval of time between the positive voltage pulse and the negative voltage pulse subsequent to the positive voltage pulse, both the negative voltage pulse and the positive voltage pulse being outputted by the pulsed power supply.

6. The substrate processing method according to claim 4, wherein an interval of time to output the floating potential is 50 ns or shorter.

7. A substrate processing method using a substrate processing apparatus, comprising:
- a first step of applying a negative voltage pulse from a pulsed power supply included in the apparatus; and
- a second step of applying a floating potential for an interval of time between the negative voltage pulse and a positive voltage pulse from the pulsed power supply subsequent to the negative voltage pulse;

wherein the apparatus includes:
- a chamber;
- a first electrode provided inside the chamber;
- a second electrode provided inside the chamber so that the second electrode faces the first electrode and to hold a substrate;
- an RF power supply to apply an RF voltage having a frequency of 50 MHz or higher to the second electrode; and
- the pulsed power supply to repeatedly apply a voltage waveform with the RF voltage to the second electrode, the voltage waveform including the negative voltage pulse and the positive voltage pulse;

wherein the pulsed power supply includes a first power supply to output a first voltage, a second power supply to output a second voltage, and a switching unit configured to switch off the first power supply and the second power supply to block off the first voltage and the second voltage applied to the second electrode so that the floating potential is applied.

8. The substrate processing method according to claim 7, further comprising:
applying a ground potential for an interval of time between the positive voltage pulse and the negative voltage pulse subsequent to the positive voltage pulse, both the negative voltage pulse and the positive voltage pulse being outputted by the pulsed power supply.

9. The substrate processing method according to claim 7, wherein an interval of time to output the floating potential is 50 ns or shorter.

* * * * *